(12) United States Patent
Swaim et al.

(10) Patent No.: US 10,914,756 B2
(45) Date of Patent: Feb. 9, 2021

(54) MINIATURE TEST PROBE

(71) Applicant: Keysight Technologies, Inc., Santa Rosa, CA (US)

(72) Inventors: Jason Andrew Swaim, Colorado Springs, CO (US); Daniel A. Garcia, Colorado Springs, CO (US); Michael Thomas McTigue, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 19 days.

(21) Appl. No.: 16/103,352

(22) Filed: Aug. 14, 2018

(65) Prior Publication Data
US 2020/0057094 A1 Feb. 20, 2020

(51) Int. Cl.
| | |
|---|---|
| *G01R 1/067* | (2006.01) |
| *G01R 1/04* | (2006.01) |
| *G01R 1/18* | (2006.01) |
| *H05K 1/18* | (2006.01) |
| *H05K 1/11* | (2006.01) |
| *H05K 1/02* | (2006.01) |
| *G01R 1/24* | (2006.01) |

(52) U.S. Cl.
CPC ....... *G01R 1/06744* (2013.01); *G01R 1/0416* (2013.01); *G01R 1/06755* (2013.01); *G01R 1/18* (2013.01); *G01R 1/24* (2013.01); *H05K 1/0271* (2013.01); *H05K 1/113* (2013.01); *H05K 1/189* (2013.01)

(58) Field of Classification Search
None
See application file for complete search history.

(56) References Cited

U.S. PATENT DOCUMENTS

| 4,716,500 A | 12/1987 | Payne |
| 7,019,544 B1 | 3/2006 | Jacobs et al. |
| 7,378,832 B2 | 5/2008 | Sutono et al. |

(Continued)

OTHER PUBLICATIONS

"Keysight Delivers the Industry's Smallest Solder-in Probe Head for High Performance Oscilloscopes", Keysight Technologies, Inc., Aug. 1, 2018, https://about.keysight.com/en/newsroom/pr/2018/01aug-nr18081.shtml, 2 pgs.

*Primary Examiner* — Jermele M Hollington (57) ABSTRACT

A miniature probe for measuring small voltage signals of a DUT includes a probe body having a flexible substrate and signal transmission lines running a longitudinally, and a first probe connection circuit located at a first end of the probe body and including exposed wires, SMT components coupled between the exposed wires and the signal transmission lines, respectively, and a local mechanical stiffener mounted adjacent the SMT components. The wires are connectable to the DUT for receiving the voltage signals. The probe further includes a second probe connection circuit located at a second end of the probe body, and including transmission line connectors coupled to the signal transmission lines, respectively, and a bent portion of the flexible substrate between the probe body and the transmission line connectors. The bent portion enables the transmission line connectors to exit the probe substantially axially, relative to the longitudinal length of the probe body.

17 Claims, 7 Drawing Sheets

(56) References Cited

U.S. PATENT DOCUMENTS

| | | | |
|---|---|---|---|
| 9,404,940 B1 | 8/2016 | Campbell et al. | |
| 10,502,762 B2 * | 12/2019 | Swaim | G01R 3/00 |
| 2008/0007278 A1 * | 1/2008 | Ku | G01R 31/2889 |
| | | | 324/756.03 |
| 2009/0085591 A1 | 4/2009 | Soubh et al. | |
| 2010/0073018 A1 * | 3/2010 | Ruppelt | G01R 1/06705 |
| | | | 324/755.01 |
| 2013/0021053 A1 * | 1/2013 | Ku | G01R 1/073 |
| | | | 324/756.03 |
| 2019/0162756 A1 * | 5/2019 | Utsumi | G01R 31/2831 |

* cited by examiner

MINIATURE TEST PROBE

STATEMENT REGARDING PRIOR DISCLOSURES UNDER 37 CFR 1.77(b)(6)

Embodiments of the subject wideband dual directional coupler(s) were disclosed in an article entitled "Keysight MX0100A InfiniiMax Micro Probe Head Designed to Access Small Geometry, High Density Target Devices," https://about.keysight.com/en/newsroom/pr/2018/01aug-nr18081.shtml (Aug. 1, 2018). A copy of the article is submitted with an information disclosure statement that is being concurrently filed herewith. The publication is believed to fall under the exception of 35 U.S.C. § 102(b)(1) and is therefore believed not to constitute prior art.

BACKGROUND

Due to widespread availability of miniature processors and circuits, much smaller electronic devices are available. For example, devices designed to connect to wireless networks, particularly those operating at high frequencies (e.g., greater than about 20 GHz), are becoming miniaturized. The smaller devices tend to be difficult to test due in part to the corresponding small size of test pads and ports. For example, the wires of a conventional voltage test probe are typically about 0.007 inch to about 0.010 inch in diameter, which may be too large to attach to test pads of a typical small device under test (DUT), for example, by soldering, in order to perform device testing and/or calibration. Also, a conventional differential voltage probe has a width of about 0.150 inch to about 0.200 inch in order to provide sufficient separation of the two signal lines to prevent cross-talk and other electromagnetic interference between signals.

Smaller test probes, including voltage probes, are needed to efficiently test the small electronic devices. However, fabricating smaller test probes presents a number of challenges, including preventing electromagnetic interference between the signal lines and sufficiently stabilizing the mechanical structure to enable practical use without damaging the test probe. For example, a miniature test probe would require very small and thin material substrates and/or printed circuit boards (PCBs), which generally need to be locally stiffened in order to provide structural strength and to enable physical handling. Conventionally, there are a number of ways to stiffen a PCB. For example, copper layers may be added to the PCB. However, for a PCB with circuitry for radio frequency (RF) signaling, additional metal layers can affect performance, and increase size and cost. Further, some of the additional metal may need to be removed from non-stiffened regions of the PCB, which requires additional processing steps. As another example, the PCB may be adhered to an additional component for extra stiffness, such as a flat piece of FR4 plastic, polycarbonate or aluminum. This typically involves a labor intensive (manual) process, which increases costs and hinders efforts to precisely position the stiffener, as required. In addition, the adhesive used to attach the PCB to the additional component has its own set of material properties and limitations that need to be considered, and can degrade with time and temperature.

Accordingly, there is a need for a miniature test probe that is able to connect to very small test ports of modern devices, is structurally robust, highly flexible, and does not generate electromagnetic interference between signals being tested. There is also a corresponding need for a process to efficiently and accurately fabricate such a miniature test probe.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings. Generally, it is understood that the drawings and the various elements depicted therein are not drawn to scale.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed"

means that one skilled in the art would consider the removal to be acceptable. As used in the specification and the appended claims and in addition to its ordinary meaning, the terms "approximately" and "about" mean to within an acceptable limit or amount to one having ordinary skill in the art. For example, "approximately the same" and "about the same" mean that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Unless otherwise noted, when a first component is said to be connected to a second component, this encompasses examples where one or more intermediate components may be employed to connect the two components to each other. However, when a first component is said to be directly connected or directly coupled to a second component, this encompasses examples where the two components are connected to each other without any intermediate or intervening components.

According to various embodiments, a miniature, differential, high bandwidth test probe (e.g., voltage probe) is constructed using high-speed flex circuit and flex probe material, surface mount, and through-hole assembly techniques. At a distal end, the test probe has miniature input wires that are configured to be soldered to a device under test (DUT) during testing. A proximal end of the test probe connects to a probe amplifier using small RF transmission line connectors, such as surface mount subminiature push-on connectors (SMP) connectors, for example. Embodiments of the test probe provide wideband probes that may function from DC to more than 20 GHz. For example, the test probe may be used to measure small voltage signals (e.g., less than about 5V) that include broadband signals at high speeds (e.g., greater than about 20 GHz). That is, the test probe may have a flat frequency response from DC to about 20 GHz. The small size allows connection to ever smaller DUTs by accommodating the corresponding smaller pads and leads. Also, the small size, lower mass, and high flexibility of the test probe places less strain on what typically is a delicate connection of the DUT.

According to a representative embodiment, a miniature differential test probe is provided for measuring small voltage signals of a DUT at high speeds. The test probe includes a probe body, a first probe connection circuit and a second probe connection circuit. The probe body includes a flexible substrate and signal transmission lines running a longitudinal length of the probe body. The probe body may further include a ground line between the signal transmission lines. The first probe connection circuit is located at a first (distal) end of the probe body, the first probe connection circuit including exposed wires, components coupled between the exposed wires and the signal transmission lines, respectively, and a local mechanical stiffener mounted opposite the components. The exposed wires are connectable to the DUT for receiving the small voltage signals. The second probe connection circuit is located at a second (proximal) end of the probe body, opposite the first end, the second probe connection circuit including subminiature transmission line connectors coupled to the signal transmission lines, respectively, and a bent portion of the flexible substrate located between the probe body and the subminiature transmission line connectors. The bent portion of the flexible substrate enables the subminiature transmission line connectors to exit the probe substantially axially, relative to the longitudinal length of the probe body. The mechanical stiffener may be formed of an adhesive extruded to a predetermined U-shape that increases structural support for the components.

Figure 1:
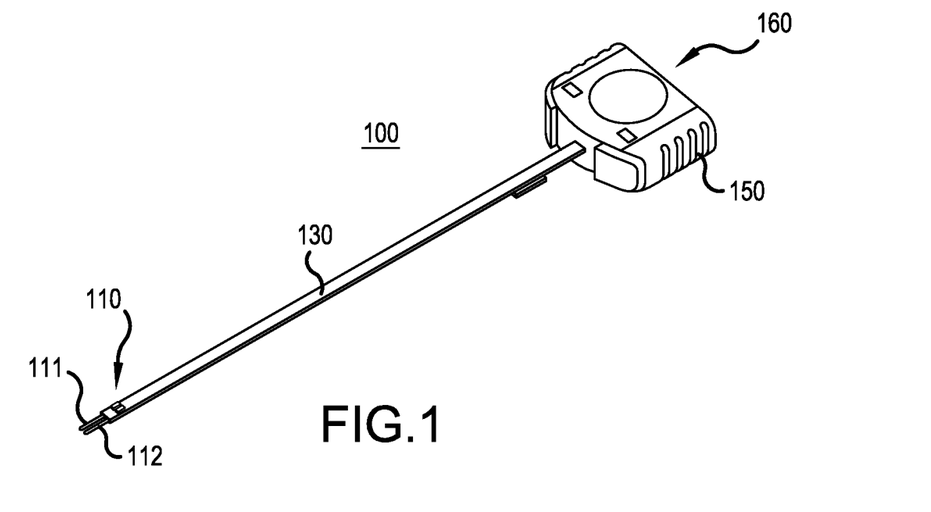
FIG. 1 is a top perspective view of a miniature test probe, according to a representative embodiment.

FIG. 1 is a top perspective view of a miniature test probe, according to a representative embodiment.

Referring to FIG. 1, test probe 100 may be a differential voltage probe, for example. The test probe 100 includes a first probe connection circuit 110 at a distal (first) end, a housing 150 that contains a second probe connection circuit 160 at a proximal (second) end, and a flexible probe body 130 electrically connecting the first and second probe connection circuits 110 and 160. The housing 150 may be formed of plastic, for example, with openings on a connection side exposing small transmission line connectors, discussed below, where the connection side faces away from an end of housing 150 attached to the probe body 130.

The first probe connection circuit 110 includes wires 111 and 112 electrically coupled to signal transmission lines (not shown in FIG. 1). The wires 111 and 112 are exposed, and the tips of the wires 111 and 112 are connectable to a DUT (not shown) by soldering, for example, in order to receive small voltage signals during DUT testing. The second probe connection circuit 160 includes a pair of transmission line connectors (not shown in FIG. 1), such as SMP connectors or other coaxial connectors, accessible through openings in the housing 150. The transmission line connectors are configured to connect to a probe amplifier (not shown) and ultimately to a measurement instrument, such as an oscilloscope, e.g., for measuring the small voltage signals of the DUT. The probe body 130 includes a flexible substrate with a flexible microstrip. The flexible microstrip includes the signal transmission lines and a ground line between the signal transmission lines, running longitudinally along the probe body 130, discussed below with reference to FIG. 2. Notably, although a differential test probe is described herein with reference to the figures for purposes of illustration, it is understood that the description also generally applies to a single ended test probe, which would have one signal transmission line and corresponding exposed wire, and one transmission line connector, without departing form the scope of the present teachings.

The overall size of the test probe 100 is less than conventional test probes in order to accommodate physical and electrical attachment to and measurement of miniature and subminiature DUT packages, such as 01005 resistors or capacitors, very small outline package (VSOP) semiconductors, and Quad Flat No-lead (QFN) packages, for example. In various embodiments, a total length of the test probe 100, in a longitudinal direction, between a tip of the first probe connection circuit 110 at the distal end and a connector end of the housing 150 (and the second probe connection circuit 160) at the proximal end is between about 1 inch and about 8 inches, for example. Also, a width of the test probe 100 at the tip of the first probe connection circuit 110 is between about 0.040 inch and about 0.100 inch, for example. This is about 15 percent to about 50 percent smaller than typical conventional differential test probes. The comparatively smaller width of the test probe 100, in particular, enables improved connectivity between miniature exposed wires 111 and 112 of the first probe connection circuit 110 and the miniature pads and leads of the smaller DUT. The small size also allows multiple test probes 100 to be attached to the same DUT in closer proximity to one another in the event that multiple signals from the DUT are to be measured simultaneously. Also, the wires 111 and 112 are formed of small diameter wire (e.g., about 0.004 inch). In comparison, wires of typical conventional test probes are between about 0.007 inch and about 0.010 inch in diameter. The length of the test probe 100, the width of the test probe 100 at the tip, and/or the diameter of the wires 111 and 112 may vary to provide unique benefits for any particular situation or to meet application specific design requirements of various implementations, as would be apparent to one skilled in the art.

The small diameter wires 111 and 112 may be formed of gold-plated annealed nickel wire, for example, although other materials may be incorporated without departing from the scope of the present teachings. The gold plating, in particular, provides processing advantages, including the ability to be laser-cut in addition to providing an electrical connection through high temperature soldered joints without having to reflow the gold plating. Also, the gold plating is easily solderable to the DUT by an end-user to provide the connection to the DUT by the test probe 100 to perform testing. The gold plating minimizes electrical skin loss while the annealed nickel allows for significant flexing and straining of the wires 111 and 112 without work hardening, making the connection between the test probe 100 and the DUT very robust. Also, nickel has low thermal conductivity, which results in very little heat being transferred to the test probe 100 when the tips of the wires 111 and 112 are soldered to the DUT to perform testing. The limited heat transfer enables high temperature solder reflow of the DUT connection and not the test probe components, which could damage the test probe 100.

Figure 2:
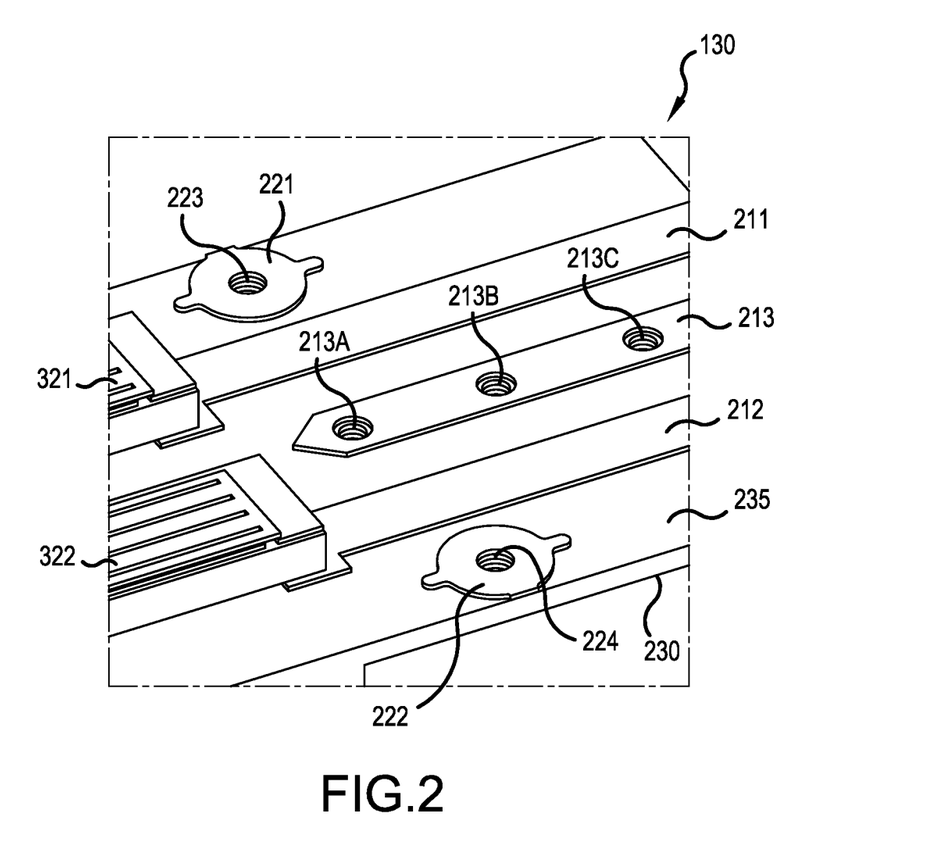
FIG. 2 is a top perspective view of a portion of a probe body of the miniature test probe in FIG. 1, where it connects with a first probe connection circuit, according to a representative embodiment.

FIG. 2 is a top perspective view of a portion of the probe body 130 where it connects with the first probe connection circuit 110 at the distal end of the test probe 100, according to a representative embodiment.

Referring to FIG. 2, the probe body 130 includes flexible substrate 230 including a flexible probe microstrip 235. The substrate 230 may be formed of flex circuit material, such as Pyralux® TK flexible circuit material (available from DuPont™), for example, to accommodate low electrical loss, as well as mechanical bending and other manipulation of the test probe 100. Of course, other flexible dielectric material(s) may be incorporated without departing from the scope of the present teachings. The flex circuit material may include a ground plane electrically connectable to ground through the coaxial connecters, a dielectric layer, and a signal plane which is etched to provide the microstrip 235. In the depicted embodiment, contact pads 221 and 222 are formed on a top surface of the substrate 230, and vias (through-holes) 223 and 224 are formed through the contact pads 221 and 222, respectively, the substrate 230. The vias 223 and 224 may be connected to the ground plane and used for ground test points, for example.

The microstrip 235 of the probe body 130 includes signal transmission lines 211 and 212, and ground line 213, which run longitudinally along the probe body 130. Each of the signal transmission lines 211 and 212 and the ground line 213 may be formed of copper, for example. The signal transmission lines 211 and 212 run a length of the probe body 130, electrically connecting the first probe connection circuit 110 with the second probe connection circuit 160 (not shown in FIG. 2). The ground line 213 is formed between the signal transmission lines 211 and 212. In the depicted embodiment, the ground line 213 has small vias formed at intervals along all or a portion of its length, indicated by representative vias 213A, 213B and 213C, although it is understood that more than three vias may be included. The vias (e.g., vias 213A, 213B and 213C) connect the ground line 213 to the ground plane of the substrate 230, and reduce or minimize stresses due to flexing of the probe body 130. The ground line 213 otherwise does not connect with the first probe connection circuit 110 or the second probe connection circuit 160.

The presence of the ground line 213 provides electromagnetic shielding between the signal transmission lines 211 and 212. This shielding enables the signal transmission lines 211 and 212 to be placed closer to one another without electrically coupling, than would otherwise be possible without the ground line 213. For example, assuming the ground line 213 has a width of about 0.010 inch, and each of the signal transmission lines 211 and 212 has a width of about 0.01025 inch, then the signal transmission lines 211 and 212 may be only about 0.029 inch apart from one another. In comparison, typical conventional test probes use coaxial cables as transmission lines, so spacing between the coaxial cables is limited by the diameters, which is a minimum of about 0.060 inch apart. Placing the signal transmission lines 211 and 212 in closer proximity reduces overall size of the probe body 130, and thus reduces the size of the test probe 100, as compared to conventional test probes. The width of the ground line 213, the width of each of the signal transmission lines 211 and 212, and/or the separation of the signal transmission lines 211 and 212 may vary to provide unique benefits for any particular situation or to meet application specific design requirements of various implementations, as would be apparent to one skilled in the art. The ground line 213 also provides controlled impedance (e.g., 50 ohms) along the length of the test probe 100.

Figure 3:
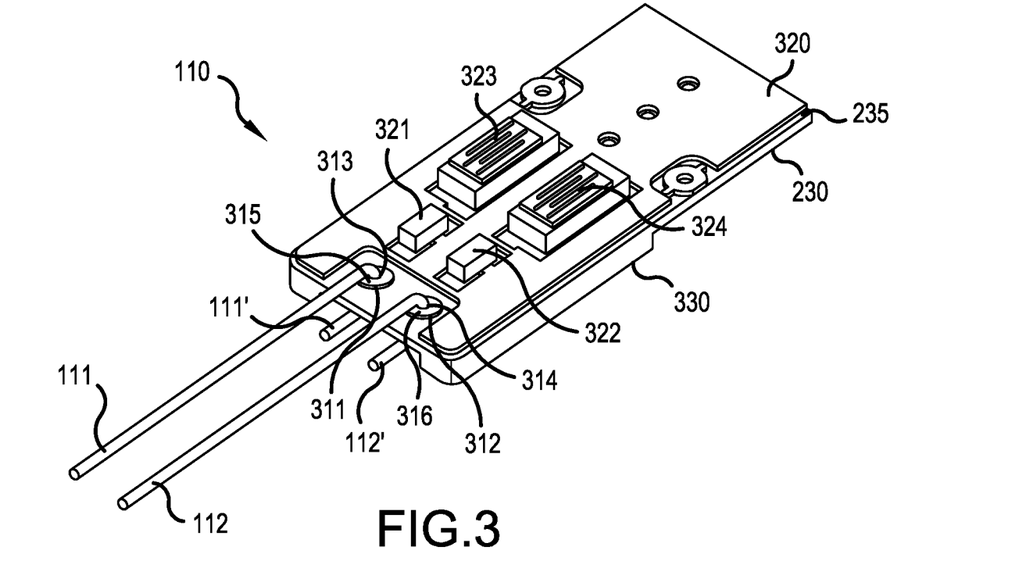
FIG. 3 is a top perspective view of a first probe connection circuit at a distal end of the miniature test probe in FIG. 1, according to a representative embodiment.

FIG. 3 is a top perspective view of the first probe connection circuit 110 at the distal end of the test probe 100, according to a representative embodiment.

Referring to FIG. 3, the first probe connection circuit 110 includes the wires 111 and 112, and corresponding contact pads 311 and 312 on the top surface of the substrate 230. Vias 313 and 314 are formed through the contact pads 311 and 312, respectively, and the substrate 230. Solder joints 315 and 316 may extend through the vias 313 and 314 (shown as solder joints 315' and 316' on the bottom surface of the substrate 230 in FIG. 4). The wire 111 has a hooked end 111', which passes through the via 313 to further mechanically secure the wire 111 to the first probe connection circuit 110. Likewise, the wire 112 has a hooked end 112', which passes through the via 314 to further mechanically secure the wire 112 to the first probe connection circuit 110. The hooked ends 111' and 112' together with the solder joints 315 and 316 provide flexibility and ensure robust electrical connections. The hooked ends 111' and 112' also allows the solder joint to be reflowed by the user when connecting to their DUT, without disturbing its position or attachment strength.

The first probe connection circuit 110 further includes components coupled between the wires 111 and 112, and the signal transmission lines 211 and 212, respectively. The components may be provided as differential pairs. In the depicted embodiment, the components may be surface mount technology (SMT) components, for example, including a differential pair of resistors 321 and 322, and a differential pair of RC networks 323 and 324. The resistor 321 and the RC network 323 are connected in series between the contact pad 311 for the wire 111 and the signal transmission line 211, and the resistor 322 and the RC network 324 are connected in series between the contact pad 312 for the wire 112 and the signal transmission line 212. In an embodiment, the RC networks 323 and 324 may be tunable to compensate for the individual response of the test probe 100. For example, each of the RC networks 323 and 324 may be a ceramic die or thick-film with a resistance on one side a capacitance on the opposite side. The capacitance may be an interdigitated-style capacitor that is laser trimmable, in-situ, enabling the RC networks 323 and 324 to be tuned after initial fabrication. In alternative embodiments, the RC networks 323 and 324 may be replaced by additional resistors or removed altogether, without departing from the scope of the present teachings.

A flexible protective cover 320 is formed over the first probe connection circuit 110 and the flexible probe body 130. The protective cover 320 may be formed of a thin layer of solder mask or polyimide, for example, and is attached to the first probe connection circuit 110 and the flexible probe body 130 by adhesive, for example. Generally, the protective cover 320 encapsulates the microstrip 235 and the corresponding signal transmission lines 211 and 212 and ground line 213, providing additional electrical isolation and mechanical adhesion during flexing of the flexible probe body 130. The protective cover 320 provides an opening over each of the resistors 321 and 322 and each of the RC networks 323 and 324, where the resistors 321 and 322 and the RC networks 323 and 324 protrude through the respective openings. The protective cover 320 also provides as a distal end opening over the contact pads 311 and 312, where the wires 111 and 112 protrude through the opening. The protective cover 320 also enables the use of solder for precision attachment of the (SMT) components and wires, including the resistors 321, 322, the RC networks 323, 324 and the wires 111, 112.

The locations of components in the first probe connection circuit 110 at the distal end of the test probe 100, as well as etched metal geometries to which the components are connected, are optimized to ensure an appropriate mix of manufacturability and electrical and mechanical performance. This may include, for example, pitch between the wires 111 and 112, size of the vias 313 and 314, pitch between the differential pairs of components (resistors 321 and 322, and RC networks 323 and 324), widths of solder mask dams, sizes of solder pads, and the like. Optimizing the various features may be accomplished through simulation and modeling, as well as empirical testing, as would be apparent to one reasonably skilled in the relevant art. For example, increased separation between the RC networks 323 and 324 improves loading performance of the test probe 100, which must be reconciled with maintaining the small width of the test probe 100. The flex circuit material of the substrate 230 can tolerate high temperatures. Also, the remainder of the test probe 100 has been designed using high-temperature materials (e.g., functional at temperatures from −55° C. to +150° C.). Conventional high-speed differential probes are not as mechanically robust and electrically stable as the test probe 100 under these environmental conditions, for example, due to polymers typically used in the coaxial cables used as transmission lines.

The first probe connection circuit 110 also includes a local mechanical stiffener 330 mounted on an opposite (bottom) side of the substrate 230 than the components (e.g., the resistors 321, 322 and the RC networks 323, 324). The mechanical stiffener 330 mechanically reinforces the substrate 230 in the area of the components, enabling the components to be more efficiently and accurately attached to the etched metal geometries on the top surface of the substrate 230. That is, the mechanical stiffener 330 prevents flexing in the region of the substrate 230 on which the components are loaded, which generally prevents cracking of solder joints and/or damage to the components themselves, for example. The mechanical stiffener 330 also allows for easier manipulation of the distal end of the test probe 100, including positioning and stabilizing the wires 111 and 112 for soldering to the DUT.

Figure 4:
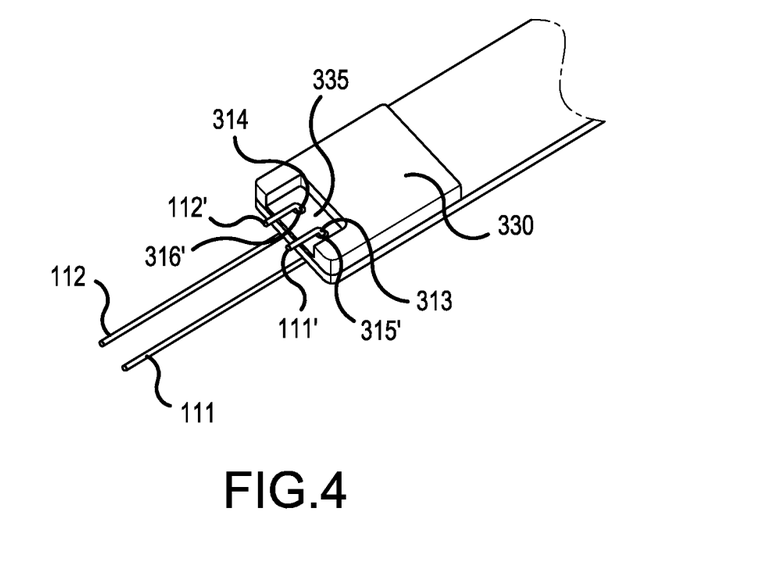
FIG. 4 is a bottom perspective view of a mechanical stiffener at a distal end of the miniature test probe in FIG. 1, according to a representative embodiment.

FIG. 4 is a bottom perspective view of the mechanical stiffener 330 mounted to the bottom side of the substrate 230 at the distal end of the test probe 100, according to a representative embodiment.

Referring to FIG. 4, the mechanical stiffener 330 is formed in a substantially U-shape. In an embodiment, the mechanical stiffener 330 may be formed of adhesive, such as an epoxy adhesive and other curable adhesives, simplifying application and shaping of the mechanical stiffener 330. The adhesive may be the same adhesive used for attachment of the SMT components to simplify fabrication. For example, the adhesive of the mechanical stiffener may be LOCTITE® 3619™, available from Henkel Corporation. However, other adhesives may be used, for attachment of the SMT components and/or for formation of the mechanical stiffener 330, without departing from the scope of the present teachings. An open end 335 of the U-shape faces the distal end of the test probe 100. The adhesive is applied to the bottom side of the substrate 230 in the U-shape to avoid filling vias 313 and 314 and the solder joints 315' and 316', yet still stiffens the area directly under the SMT components loaded on top side. That is, the open end 335 exposes a portion of the substrate 230 in which the vias 313 and 314 are formed. Accordingly, the hooked ends 111' and 112' are able to pass through the vias 313 and 314 unencumbered by the mechanical stiffener 330. The wires 111 and 112 are therefore more maneuverable, and may be replaced, if desired. Also, the ends of the U-shape prevent the vias 313 and 314 from flexing, as they are in a region of maximum stress on the test probe 100.

The adhesive may be deposited onto the bottom side of the substrate 230 using standard equipment. For example, the adhesive may be jetted, dispensed, printed, or the like, without departing from the scope of the present teachings. The overall thickness of the mechanical stiffener 330 is precisely controlled, and the mechanical stiffener 330 has a shape of approximately 0.090 inch×0.090 inch shape, for example, although the dimensions may vary to provide unique benefits for any particular situation or to meet application specific design requirements of various implementations, as would be apparent to one skilled in the art. The adhesive of the mechanical stiffener 330 also acts as an electrically protective element, which helps to electrically isolate any exposed wires to the region of the DUT.

Figure 5:
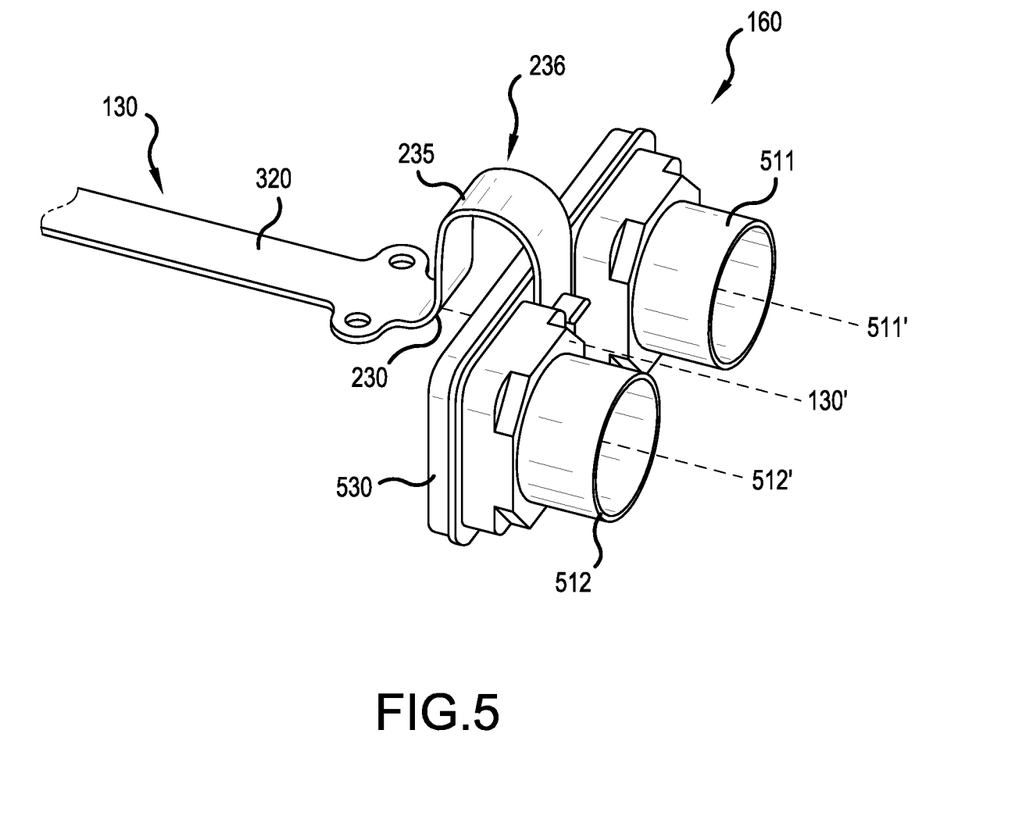
FIG. 5 is a top perspective view of a second probe connection circuit at a proximal end of the miniature test probe in FIG. 1, according to a representative embodiment.

FIG. 5 is a top perspective view of the second probe connection circuit 160 at a proximal end of the test probe 100, according to a representative embodiment.

Referring to FIG. 5, the second probe connection circuit 160 includes transmission line connectors 511 and 512, which are connected to the signal transmission lines 211 and 212 (not shown in FIG. 5), respectively, at a proximal end of the flexible probe body 130. The transmission line connectors 511 and 512 may be surface mount SMP connectors, for example, although different types of connectors, including different types of coaxial connectors, may be incorporated without departing from the scope of the present teachings. The transmission line connectors 511 and 512 are attached to another mechanical stiffener, connector stiffener 530, configured to provide rigid support. The connector stiffener 530 may be formed of fiberglass, for example, although the connector stiffener 530 may be formed of other compatible materials, without departing from the scope of the present teachings. In this case, fiberglass being non-metallic prevents disturbance of the controlled impedance line and termination.

The second probe connection circuit 160 further includes a bent portion 236 of the substrate 230 and the microstrip 235 (including the signal transmission lines 211 and 212, and the ground line 213), which extend from the proximal end to the distal end of the probe body 130. The bent portion 236 is configured such that the transmission line connectors 511 and 512 face in a substantially axial direction from the test probe 100. The housing 150 is configured to form the bend of the bent portion 236, and to otherwise control the bend radius and geometry for the desired positioning of the transmission line connectors 511 and 512. For example, in an embodiment, the housing 150 (not shown in FIG. 5) holds the proximal end of the probe body 130 substantially perpendicular to a back surface of the connector stiffener 530, which is opposite a front surface to which the transmission line connectors 511 and 512 are attached. When the proximal end of the probe body 130 is substantially perpendicular to the back surface of the connector stiffener 530 (as shown in FIG. 5), a longitudinal axis 130' of the of the probe body 130 is substantially parallel to a center longitudinal axis 511' of the transmission line connector 511 and a center longitudinal axis 512' of the transmission line connector 512. Of course, the center longitudinal axes 511' and 512' are substantially parallel to one another, regardless of orientation of the connector stiffener 530 to the probe body 130.

In other words, the transmission line connectors 511 and 512 are vertical mount connectors, and the bent portion 236 provides a substantially right-angle bend within in the test probe 100, such that the transmission line connectors 511 and 512 exit the test probe 100 axially. Notably, vertical mount connectors are easier to attach to a very thin PCB, such as the substrate 230, than an edge (horizontal) mount connector, for example, both mechanically and electrically. The vertical mount connectors provide more bonding/solder surface for a good mechanical joint, and less drastic impedance continuity when transitioning from the PCB to connector geometries.

The housing 150 contains the distal end of the probe body 130, the bent portion 236, the connector stiffener 530, and the transmission line connectors 511 and 512. The housing 150 also defines openings exposing at least the ends of the transmission line connectors 511 and 512, enabling access thereto. For example, the transmission line connectors 511 and 512 may be connected to complementary connectors on a probe amplifier and/or a measurement instrument, such as an oscilloscope, e.g., for measuring voltage output from a DUT to which the wires 111 and 112 have been attached. The housing 150 is configured to prevent stresses from building on solder joints while mating to and/or de-mating from the probe amplifier and/or the measurement instrument. The solder joints include those attaching the transmission line connectors 511 and 512 to the PCB and/or connector stiffener 530, as well as solder joints of the signal transmission lines. The housing 150 may include rib features that capture the connector stiffener 530 for mating, and features that capture the shoulders of the transmission line connectors 511 and 512 for de-mating.

Figure 6:
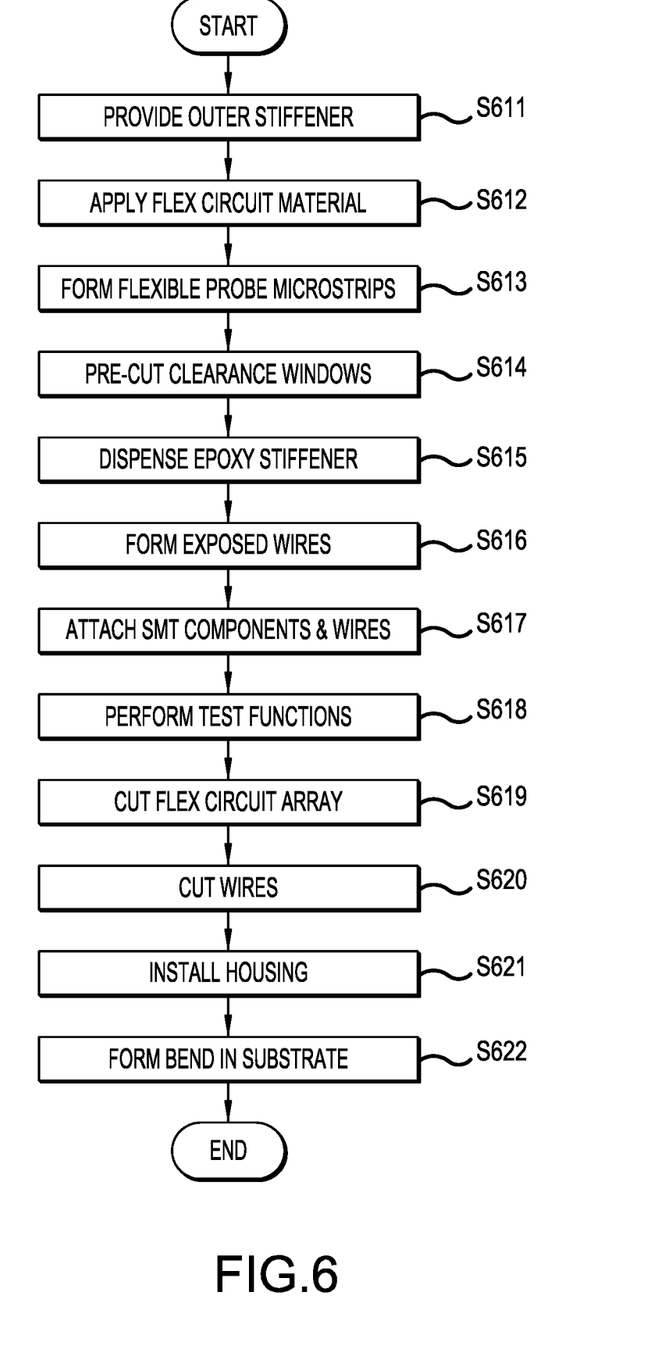
FIG. 6 is a simplified flow diagram of a method for fabricating a miniature test probe, according to a representative embodiment.

FIG. 6 is a simplified flow diagram of a method for fabricating miniature test probes, according to a representative embodiment. More particularly, the method shown in FIG. 6 is directed to fabricating multiple miniature test probes using a flex circuit array supported by an outer stiffener, where the flex circuit array includes multiple "instances" of flexible probe microstrips (e.g., flexible probe microstrip 235) corresponding to the multiple miniature test probes. The flexible probe microstrips are singulated from the flex circuit array prior to assembly into the individual miniature test probes (e.g., test probe 100). Also, although the various steps are directed to a single flex circuit array (with multiple instances of flexible probe microstrips), it is understood that multiple flex circuit arrays may be processed according to the method substantially simultaneously.

Referring to FIG. 6, an outer stiffener is provided in block S611 and flex circuit material is applied to the outer stiffener in block S612 to form the flexible substrate (e.g., flexible substrate 230). The outer stiffener may be formed of fiberglass, for example, and defines an opening in which flex circuit material is added. The flex circuit material may be Pyralux® TK flexible circuit material, for example, as mentioned above. The flex circuit material may be applied to the outer stiffener by using a curable adhesive, for example. The combined outer stiffener, flexible substrate and flexible probe microstrips may be referred to as a flex circuit array.

Figure 7:
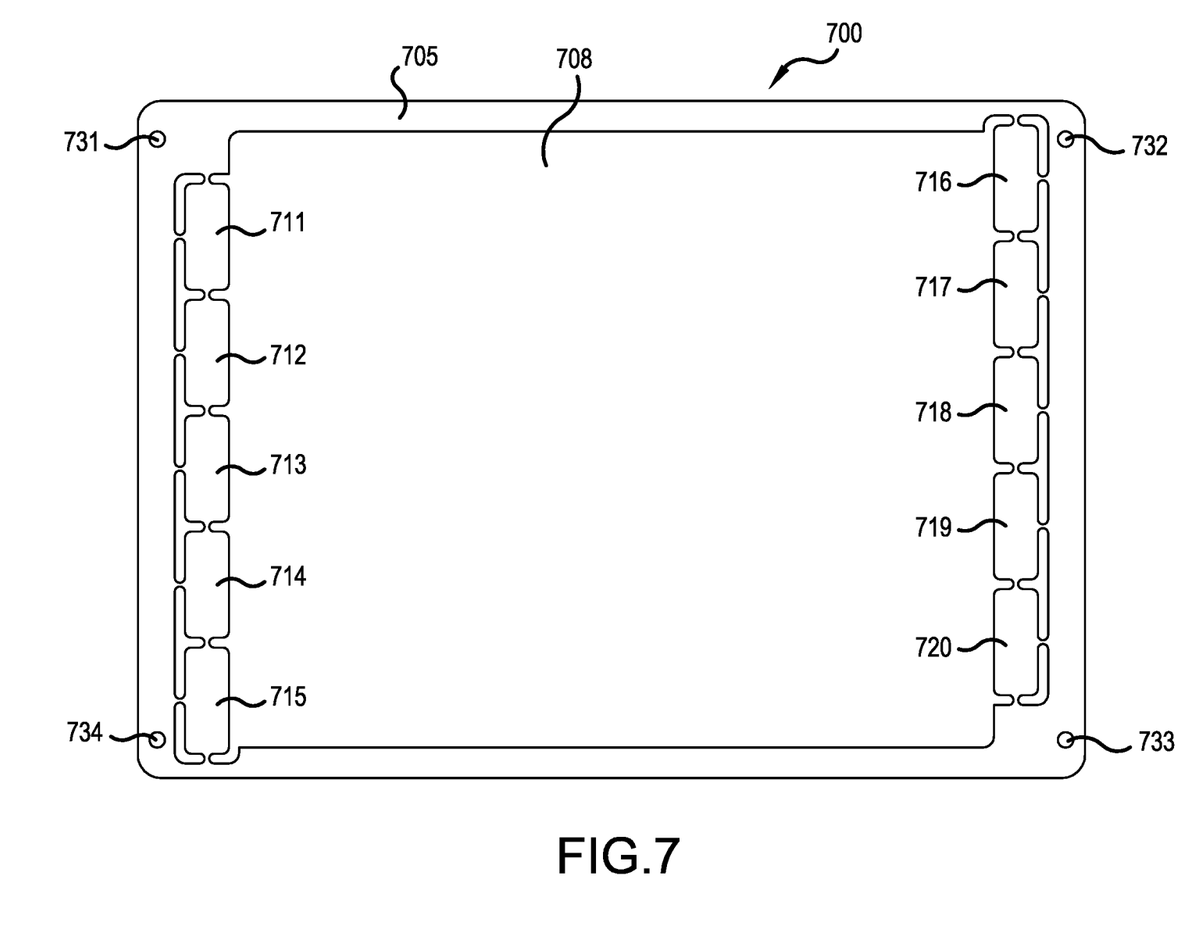
FIG. 7 is a top plan view of an outer stiffener prior to fabrication, according to a representative embodiment.
Figure 8:
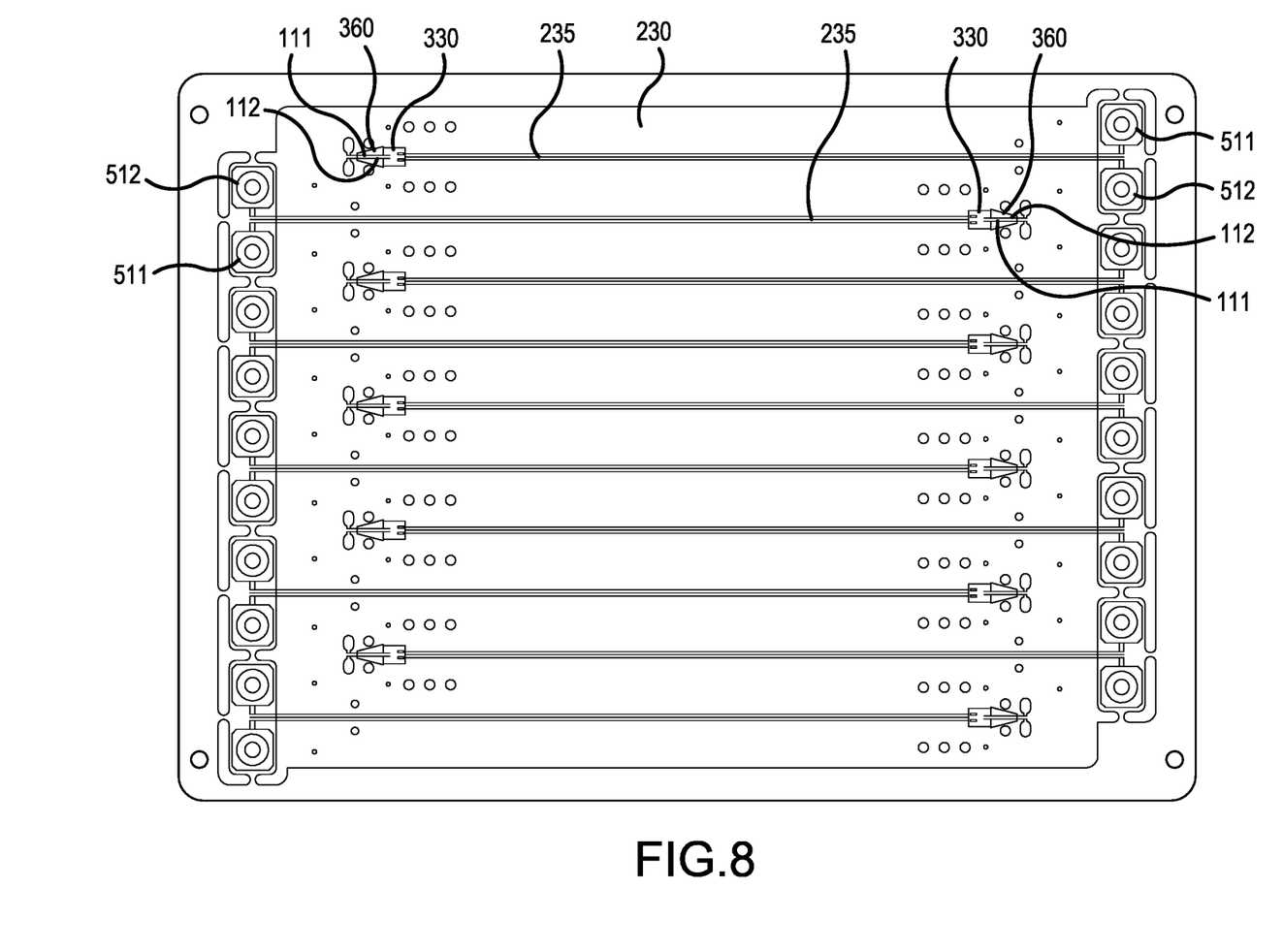
FIG. 8 is a top plan view of the flex circuit array following assembly fabrication, according to a representative embodiment.
Figure 9:
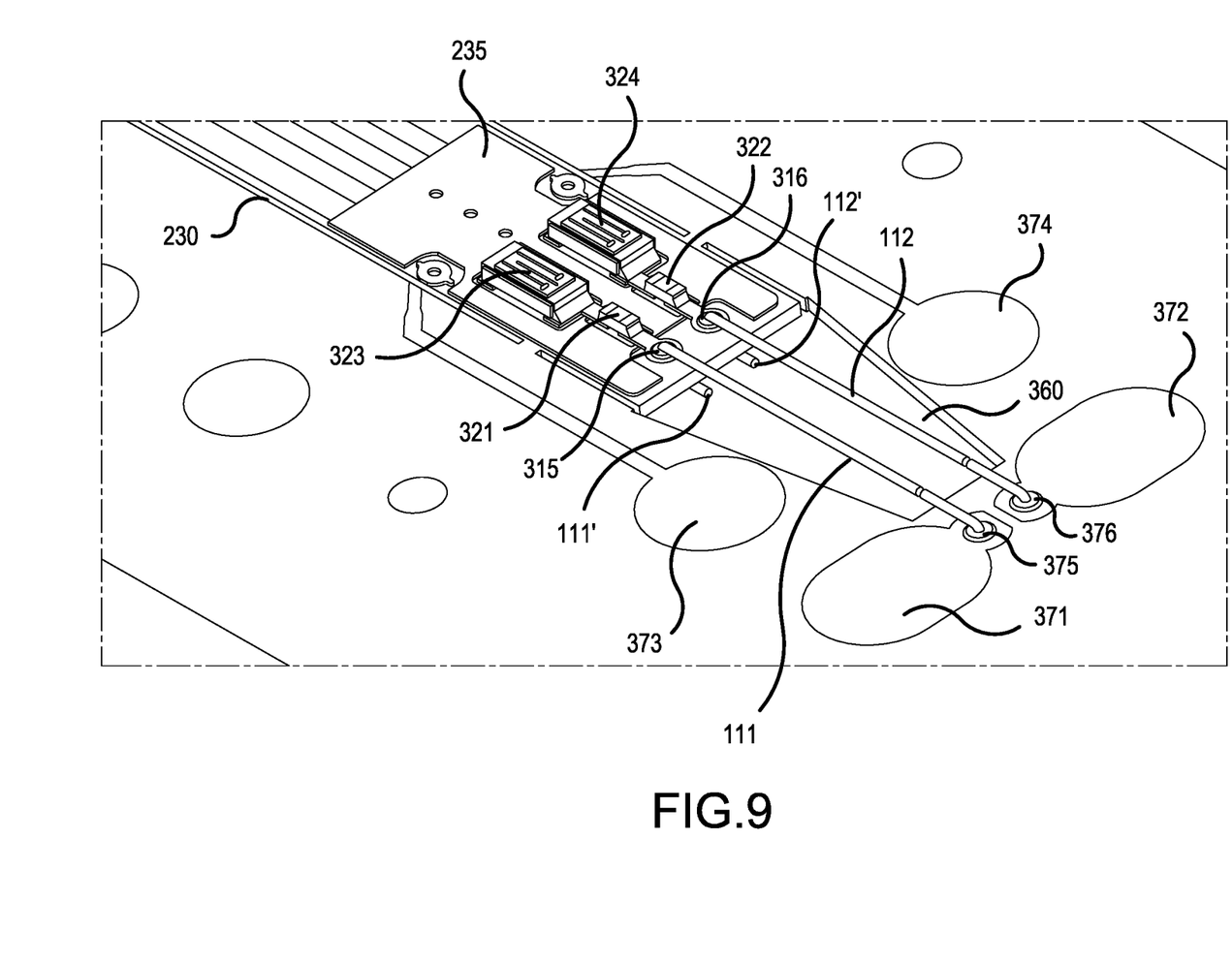
FIG. 9 is a top perspective view of an instance of a flexible probe microstrip in the flex circuit array following assembly fabrication, according to a representative embodiment.

FIG. 7 is a top plan view of an outer stiffener prior to fabrication, according to a representative embodiment. FIG. 8 is a top plan view of the flex circuit array, including the outer stiffener, flexible substrate, flexible probe microstrips, attached SMT components and other features, following assembly fabrication and prior to singulation, according to a representative embodiment. FIG. 9 is a zoomed-in top perspective view of an illustrative instance of a flexible probe microstrip in the flex circuit array shown in FIG. 8 following assembly fabrication, according to a representative embodiment.

Referring to FIG. 7, the depicted outer stiffener 700 is for creating a flex circuit array that includes ten instances of flexible probe microstrips and corresponding test probes, although the number of instances on the flex circuit array (from one or more) may vary to provide unique benefits for any particular situation or to meet application specific design requirements of various implementations, as would be apparent to one skilled in the art. The outer stiffener 700 has a rigid outer body 705 defining opening 708, and includes connector stiffeners extending from the rigid outer body 705 into the opening 708 for supporting the subminiature transmission line connectors in the second probe connection circuits of the corresponding test probes. For purposes of illustration, the outer stiffener 700 provides five connector stiffeners 711-715 on the left side of the rigid outer body 705 and five connector stiffeners 716-720 on the right side of the rigid outer body 705. The connector stiffeners 711-715 and 716-720 (which are substantially the same as connector stiffener 530 in FIG. 5) are initially held in place by tabs connecting them to an inner edge of the rigid outer body 705 and to one another.

The connector stiffeners 716-720 are staggered with respect to the connector stiffeners 711-715, such that the approximate center of each of the connector stiffeners 716-720 is opposite a space between adjacent ones of the connector stiffeners 711-715, respectively. Likewise, the approximate center of each of the connector stiffeners 711-715 is opposite a space between adjacent ones of the connector stiffeners 716-720, respectively. Accordingly, the instances of flexible probe microstrips are interleaved within the outer stiffener 700, so that more flexible probe microstrips may be arranged within the opening 708 (optimizing the instancing). The interleaved flexible probe microstrip instances take advantage of the space in that they exhibit a fan-in/fan-out design structure. That is, each of the flexible probe microstrips transitions from a larger pitch at one end (the second probe connection circuit end) to a smaller pitch (the first probe connection circuit end), so every other flexible probe microstrip in the flex circuit array can be rotated by 180 degrees to save space and simplify processing. The flexible probe microstrip instances include standard pitch, allow proper access to the SMT components, allow singulation paths between adjacent instances to be adequately processed, and maximize density within the flex circuit array.

The outer stiffener 700 provides mechanical stability and presentation for the flex circuit material of the flexible substrate, which is mechanically and electrically thin. The flexible substrate may be laminated to the rigid outer body 705 of the outer stiffener 700, using a curable adhesive, for example. The outer stiffener 700 generally enables part repeatability throughout the fabrication processes. For example, the outer stiffener 700 includes machined alignment holes, such as alignment holes 731-734, for precise alignment and fit attachment into numerous fixtures to enable automated process steps, such as solder deposition, adhesive deposition, wire insertion and forming, component placement, and laser pre- and post-processing, discussed below. The outer stiffener 700 also protects the flex circuit array during handling as it moves through various process steps.

The rigid outer body 705 handles the flex circuit material through subsequent processes, particularly those that require handling by the outer edge boundary. The rigid outer body 705 with the internal opening 708 is sufficient for accessibility for dependent processes, including laser pre- and post-processing, which requires the surfaces of the flex circuit material to be unobstructed in the singulation path (outer product edge) to achieve precise and seamless outer contours. Other such dependent processes include pre- and post-processing of fine annealed signal wires. Also, the bottom of the internal opening 708 with the flex circuit material must have sufficient surface area on which to pull a vacuum and make physical contact to the insert fixtures to have a known flat surface that ensures the top surface of the flex circuit material is essentially flat for various processes, such as soldering, adhesive deposition, part placement, and laser processing, for example.

Referring again to FIG. 6, instances of flexible probe microstrips (e.g., flexible probe microstrip 235) are formed on the flexible substrate (e.g., flexible substrate 230) in block S613. In various embodiments, each of the flexible probe microstrips includes two signal transmission lines (e.g., signal transmission lines 211 and 212) and a ground line (e.g., ground line 213), which are formed in the flex circuit material of the flexible substrate, along with the ground line 213 formed between the signal transmission lines 211 and 212, as shown in FIGS. 8 and 9. The signal transmission lines and the ground line may be formed through a chemical etching process, for example. That is, the flexible substrate (comprising the flex circuit material) may include a two layer laminate where there is a top metal (e.g., signal plane), dielectric material, and bottom metal (e.g., ground plane). The top metal is etched to form the signal transmission lines and the ground line with dielectric material exposed in between. The top ground line is connected to the bottom ground plane (e.g., the bottom metal of the laminate) through vias (e.g., representative vias 213A, 213B and 213C).

In the example shown in FIG. 8, there are ten flexible probe microstrips, which are interleaved with one another, as discussed above. More or fewer flexible probe microstrips may be included in the flex circuit array, without departing from the scope of the present teachings. Other features corresponding to each of the flexible probe microstrips may be formed at this time, as well, including signal test points 371 and 372 and ground test points 373 and 374, for example, shown in FIG. 9. The wires 111 and 112 are connected to the instance of the test probe by hooked ends 111' and 112' and corresponding solder joints 315 and 316, as discussed above. Also, before singulation, the wires 111 and 112 are connected to the signal test points 371 and 372 by corresponding solder joints 375 and 376, respectively.

In block S614, clearance windows are pre-cut in the flex circuit material to enable wire cutting in a subsequent procedure. FIGS. 8 and 9 show an illustrative clearance window 360 cut through the substrate 230. In the depicted configuration, the clearance window 360 has a trapezoidal shape to accommodate the layout, although the clearance window 360 may have other shapes, as appropriate, without departing from the scope of the present teachings. Each clearance window 360 defines a distal edge of the corresponding instance of test probe, as well as a distal end face of the finished test probe. For example, the flex circuit array may be loaded into a laser insert and adapter. Using an automated XYZ gantry and carbon dioxide ($CO_2$) Galvo laser system, for example, the clearance windows 360 may be automatically cut out through the flex circuit material to enable subsequent insertion and cutting of wires (e.g., wires 111 and 112). Compatible cutting techniques other than laser cutting may be incorporated without departing from the scope of the present teachings. After the clearance windows 360 have been cut, the flex circuit array may be loaded into a cleaning fixture, which is subjected to ultrasonic and chemical cleaning, e.g., in order to remove soot and prepare surfaces for subsequent steps.

Automatic operation of XYZ gantries and the laser or other cutting systems (as well as other automated processes and systems discussed herein) may be performed by one or more computer processors, field-programmable gate arrays (FPGAs), application specific integrated circuits (ASICs), or combinations thereof, executing software and/or firmware, implementing hard-wired logic circuits, or combinations thereof. A computer processor, in particular, may be constructed of any combination of hardware, firmware or software architectures, and may include its own memory (e.g., nonvolatile memory) for storing executable software/firmware executable code that allows it to perform the various control functions of the gantries and cutting systems. In an embodiment, the computer processor may comprise a central processing unit (CPU), for example, executing an operating system. The computer processor(s) may be in communication with respective memor(ies) that store information regarding operation of the gantries and cutting systems. The memor(ies) may be implemented by any number, type and combination of random access memory (RAM) and read-only memory (ROM), for example, and may store various types of information, such as computer programs and software algorithms. The ROM and RAM may include any number, type and combination of computer readable storage media, such as a disk drive, disk storage, flash memory, electrically programmable read-only memory (EPROM), electrically erasable and programmable read only memory (EEPROM), a universal serial bus (USB) drive, a CD, a DVD, and the like, which are tangible and non-transitory storage media (e.g., as compared to transitory propagating signals).

In block S615, adhesive stiffener is deposited on the bottom of the flex circuit array to form local mechanical stiffeners (e.g., mechanical stiffener 330) opposite the positions where the SMT components are to be mounted. In order to deposit the adhesive stiffener, the flex circuit array is loaded into a curing carrier with the bottom side facing upwards. The adhesive is automatically deposited (e.g., jetted, dispensed or printed,) in predefined regions on the bottom side of the flex circuit array, and the loaded carrier is cured in a thermal chamber, e.g., at about 100° C. The adhesive is deposited in a predetermined shape that provides structural support for the SMT components without interfering with access to the wires. The predetermined shape of the adhesive may be a substantially U-shape, as shown in FIG. 4, for example.

Exposed wires are formed in block S616. Forming the wires includes inserting the flex circuit array into a wire insertion fixture, with the top surface of the flex circuit array facing upwards. The wires (e.g., wires 111 and 112) are inserted into the designated vias (e.g., vias 313 and 314), and the protective cover (e.g., flexible protective cover 320) is installed over the surfaces of the flex circuit array. As discussed above, the protective cover may be formed of a thin layer of solder mask or polyimide, for example, and may be attached to the flex circuit array by adhesive, covering features on each side including the signal plane (e.g., including signal transmission lines 211 and 212 and ground line 213), and the ground plane of the substrate 230.

The wires may be pre-formed with 90 degree bends to enable easier insertion into the vias. The flex circuit array is then flipped over, so that the bottom surface faces upwards. The portions of the wires extending through the vias are formed into hooks (e.g., hooked ends 111' and 112'), to mechanically secure the wires within the vias. The process of inserting and bending the wires may be performed manually or automatically. As shown in FIGS. 8 and 9, the wires 111 and 112 of each of the flexible probe microstrips 235 initially extend over a corresponding clearance window 360, and attach to signal test points 371 and 372, respectively. The signal test points 371 and 372 enable testing of signal paths while the flexible probe microstrips 235 are still in the flex circuit array (prior to singulation).

In block S617, components, such as SMT components, are attached to each instance of the flexible probe microstrips. The components include the resistors (e.g., resistors 321 and 322) and RC networks (e.g., RC networks 323 and 324) in the first probe connection circuits, and the miniature connectors (e.g., transmission line connectors 511 and 512) in the second probe connection circuit. Attaching the SMT components includes loading the flex circuit array into a reflow carrier, automatically dispensing solder paste onto the flex circuit array in a predetermined pattern to attain the proper solder volume, and automatically picking and placing the SMT components onto the flex circuit array. Optionally, adhesive may be dispensed to secure the miniature connectors in the second probe connection circuit through the reflow process. The loaded carriers may be placed into a thermal chamber for optional curing, e.g., at about 100° C., and then placed into reflow chamber for solder reflow. After solder reflow, the flex circuit array may be loaded into a cleaning fixture, which is subjected to ultrasonic and chemical cleaning, e.g., in order to remove flux and prepare surfaces for subsequent steps.

In block S618, test functions are performed on one or more of the SMT components and the transmission line connectors using interconnected signal wires and sacrificial test measurement points, for example. The sacrificial test measurement points may include the signal test points 371 and 372, mentioned above, and ground test points 373 and 374, which enable testing of ground paths while the flexible probe microstrips 235 are still in the flex circuit array (prior to singulation). The testing may include measuring resistances and capacitances of the SMT components (e.g., resistors 321, 322 and RC networks 323, 324). In various embodiments, adjustments may be made to one or more of the SMT components as a result of the testing. For example, the flex circuit array may be inserted into a laser platen fixture, in which an alignment program tests the capacitors in the RC networks, and trims the capacitors in response to the testing to a desired capacitance, e.g., with a semi-rigid probe card using S-Parameter techniques, enabling the RC networks to be tuned. Additional tests, such as a time-domain reflectometer (TDR) test, may be performed in this same fixture to provide adequate signal integrity test coverage.

In block S619, the flex circuit array is singulated into separate preliminary test probes. The singulation may be performed using $CO_2$ laser, for example, to cut an outline of each instance of flexible probe microstrip 235, as well as an outline of each connector stiffener (e.g., connector stiffener 711-720) attached to each of the microstrips. For example, the flex circuit array may be inserted into a laser insert and adapter with the bottom surface facing upwards. Using an automated XYZ gantry and $CO_2$ laser system, for example, a program may be executed to automatically cut out the test probe instances and the connector stiffeners. The flex circuit array may be loaded into a cleaning fixture, which is subjected to ultrasonic and chemical cleaning. In block S620, the wires are cut to length. For example, the flex circuit array may be inserted into a laser insert and adapter with the bottom surface facing upwards to avoid angle of incident interferences with mounted components on the top side, e.g., the SMP connectors. Using an automated XYZ gantry and a Fiber laser system, for example, a program may be executed to automatically cut the wires to length. Compatible cutting techniques other than laser cutting may be incorporated without departing from the scope of the present teachings.

Referring to each singulated preliminary test probe, in block S621 the transmission line connectors and the connector stiffeners 711-720 are installed in a housing (e.g., housing 150), and in block S622, a bend of approximately 90 degrees is formed in a portion of the flexible substrate, including the flexible probe microstrip, adjacent the corresponding one of the connector stiffeners 711-720, such that the connecting features of the transmission line connectors face in a substantially axial direction from the test probe. The configuration of the housing assists in forming and maintaining the bend, including the bend radius and geometry. Optionally, adhesive may be dispensed on the housing and cured in order to secure interlocking features on the opposing housings, depending on how the lower and upper parts of the housing are connected. The resulting final test probe is the same as test probe 100 described above with reference to FIGS. 1-5.

While the disclosure references exemplary embodiments, it will be apparent to those skilled in the art that various changes and modifications may be made without departing from the spirit and scope of the present teachings. Therefore, it should be understood that the above embodiments are not limiting, but illustrative.

What is claimed:

1. A miniature differential probe for measuring small voltage signals of a device under test (DUT) at high speeds, the probe comprising:
   a probe body comprising a portion of a flexible substrate and a plurality of signal transmission lines running a longitudinal length of the probe body;

a first probe connection circuit located at a first end of the probe body, the first probe connection circuit comprising a plurality of exposed wires, a plurality of components coupled between the exposed wires and the signal transmission lines, respectively, and a local mechanical stiffener mounted opposite the components, a first end portion of the flexible substrate extending from the first end of the probe body into the first probe connection circuit, wherein the exposed wires are connectable to the DUT for receiving the small voltage signals; and a second probe connection circuit located at a second end of the probe body, opposite the first end, the second probe connection circuit comprising a plurality of transmission line connectors coupled to the signal transmission lines, respectively, a second end portion of the flexible substrate extending from the second end of the probe body into the second probe connection circuit, wherein the second end portion of the flexible substrate comprises a bent portion connected to the transmission line connectors, and arranged to enable longitudinal axes of the transmission line connectors to be substantially parallel to a longitudinal axis of the probe body.

2. The probe of claim 1, wherein the small voltage signals are broadband signals having voltage values less than about 5 volts, and the probe has a flat frequency response from DC to about 20 GHz.

3. The probe of claim 1, wherein the mechanical stiffener is formed of an adhesive extruded to a predetermined shape that increases structural support for the components.

4. The probe of claim 3, wherein the mechanical stiffener is formed in a substantially U-shape on an opposite side of first end portion of the flexible substrate from the components, an open end of the U-shape facing the first end of the probe body.

5. The probe of claim 1, wherein the first probe connection circuit further comprises a plurality of surface contact pads surrounding a plurality of vias, respectively, wherein each of the exposed wires has a hooked end passing through a corresponding one of the vias to electrically and mechanically secure each of the exposed wires to the first probe connection circuit.

6. The probe of claim 5, wherein the exposed wires are formed of gold-plated annealed nickel having a diameter of about 0.004 inch.

7. The probe of claim 6, wherein the exposed wires are configured for soldering to the DUT, and enabling high temperature solder reflow.

8. The probe of claim 1, wherein each of the plurality of transmission line connectors is a surface mounted subminiature push-on (SMP) connector.

9. The probe of claim 8, wherein the plurality of the transmission line connectors are configured to connect to a probe amplifier.

10. The probe of claim 8, wherein the second probe connection circuit further comprises a connector stiffener configured to provide rigid support for the SMP connectors.

11. The probe of claim 1, further comprising:
a housing containing the second probe connection circuit and defining openings enabling access to the transmission line connectors, respectively.

12. The probe of claim 1, wherein the flexible substrate is formed of Pyralux® TK flexible circuit material.

13. The probe of claim 1, wherein the components include at least one ceramic die having a resistor on one side and a capacitor on an opposite side, forming an RC circuit, wherein the capacitor is a laser trimmable, interdigitated-style capacitor that enables compensation for probe response.

14. The probe of claim 1, wherein the flexible substrate comprises a ground plane electrically connected to ground through the plurality of transmission line connectors and a signal plane etched to form the plurality of signal transmission lines.

15. The probe of claim 14, wherein the flexible substrate further comprises a ground line arranged a surface of the flexible substrate opposite the ground plane between the plurality of signal transmission lines, the ground line providing electromagnetic shielding between the plurality of signal transmission lines, and wherein the ground line includes vias placed at predetermined intervals connecting the ground line to the ground plane.

16. The probe of claim 15, wherein the ground line includes vias placed at predetermined intervals for minimizing stresses due to flexing of the flexible substrate.

17. The probe of claim 15, wherein the probe body further comprises a protective cover formed of a thin layer of solder mask or polyimide, and attached to the portion of the flexible substrate, covering at least the plurality of signal transmission lines and the ground line.

* * * * *